US010896928B2

(12) United States Patent
Lin

(10) Patent No.: US 10,896,928 B2
(45) Date of Patent: Jan. 19, 2021

(54) LIGHT EMITTING DIODE DISPLAY DEVICE

(71) Applicant: XIAMEN XM-PLUS TECHNOLOGY LTD, Fujian (CN)

(72) Inventor: Cheng-Hung Lin, Taiwan (CN)

(73) Assignee: XIAMEN XM-PLUS TECHNOLOGY LTD, Fujian (CN)

( * ) Notice: Subject to any disclaimer, the term of this patent is extended or adjusted under 35 U.S.C. 154(b) by 0 days.

(21) Appl. No.: 16/231,424

(22) Filed: Dec. 22, 2018

(65) Prior Publication Data

US 2019/0252461 A1 Aug. 15, 2019

(30) Foreign Application Priority Data

Feb. 14, 2018 (CN) .......................... 2018 1 0151444
Mar. 30, 2018 (CN) .......................... 2018 1 0298354

(51) Int. Cl.
*H01L 29/18* (2006.01)
*H01L 33/00* (2010.01)
(Continued)

(52) U.S. Cl.
CPC ......... *H01L 27/156* (2013.01); *G09G 3/2003* (2013.01); *G09G 3/32* (2013.01); *H01L 33/36* (2013.01); *G09G 2300/0426* (2013.01)

(58) Field of Classification Search
CPC ......... G09G 2300/0426; G09G 3/2003; G09G 3/32; H01L 27/156; H01L 33/36; H01L 25/0753; H01L 33/62
See application file for complete search history.

(56) References Cited

U.S. PATENT DOCUMENTS 7,049,639 B2    5/2006  Wang et al.
9,530,980 B2   12/2016  Oh et al.
(Continued)

FOREIGN PATENT DOCUMENTS

CN         1320895 A    11/2001
CN       101783099 A     7/2010
(Continued)

OTHER PUBLICATIONS

The 1st Office Action regarding Chinese Patent Application No. CN201810151444.3, dated Oct. 29, 2019. English Translation Provided by http://globaldossier.uspto.gov.
(Continued)

*Primary Examiner* — Meiya Li
(74) *Attorney, Agent, or Firm* — Yue (Robert) Xu; Apex Attorneys at Law, LLP

(57) ABSTRACT

A LED display device is provided in the present disclosure, including multiple pixel units arranged in array on the substrate. Each of the pixel units includes three LEDs with different emitting colors. In each row of the pixel units, a first electrode of each LED is connected directly with a lateral through line. In each column of the pixel units, a second electrode of a red LED is electrically connected with a first vertical through line via a first via hole, a second electrode of a green LED is electrically connected with a second vertical through line via a second via hole, and a second electrode of a blue LED is electrically connected with a second vertical through line via a third via hole.

18 Claims, 9 Drawing Sheets

(51) Int. Cl.
 *H01L 27/15* (2006.01)
 *G09G 3/32* (2016.01)
 *H01L 33/36* (2010.01)
 *G09G 3/20* (2006.01)

(56) References Cited

U.S. PATENT DOCUMENTS

| | | |
|---|---|---|
| 2012/0168789 A1 | 7/2012 | Lin |
| 2012/0200557 A1 | 8/2012 | Sato et al. |
| 2013/0257698 A1 | 10/2013 | Toya et al. |
| 2014/0139255 A1 | 5/2014 | Chen et al. |
| 2015/0380607 A1 | 12/2015 | Wu et al. |
| 2016/0005789 A1* | 1/2016 | Rhee ............... H01L 27/156 257/89 |
| 2016/0027380 A1 | 1/2016 | Kim et al. |
| 2016/0351650 A1 | 12/2016 | Chang |

FOREIGN PATENT DOCUMENTS

| | | |
|---|---|---|
| CN | 102024387 A | 4/2011 |
| CN | 103106858 A | 5/2013 |
| CN | 103155202 A | 6/2013 |
| CN | 103778864 A | 5/2014 |
| CN | 203731220 U | 7/2014 |
| CN | 105304015 A | 2/2016 |
| CN | 105322085 A | 2/2016 |
| CN | 105336275 A | 2/2016 |
| CN | 106298837 A | 1/2017 |
| CN | 106486490 A | 3/2017 |
| CN | 106873266 A | 6/2017 |
| CN | 107248396 A | 10/2017 |
| CN | 107342306 A | 11/2017 |
| KR | 20170097453 A | 8/2017 |
| WO | 2012050586 A1 | 4/2012 |

OTHER PUBLICATIONS

The 2nd Office Action regarding Chinese Patent Application No. CN201810151444.3, dated May 6, 2020. English Translation Provided by http://globaldossier.uspto.gov.

* cited by examiner

LIGHT EMITTING DIODE DISPLAY DEVICE

CROSS REFERENCE TO RELATED APPLICATION

This application claims the priority to Chinese Patent Application No. 201810151444.3, titled "LIGHT EMITTING DIODE DISPLAY DEVICE", filed on Feb. 14, 2018 with the Chinese Patent Office and Chinese Patent Application No. 201810298354.7, titled "LIGHT EMITTING DIODE DISPLAY DEVICE", filed on Mar. 30, 2018 with the Chinese Patent Office, which are incorporated herein by reference in their entireties.

FIELD

The present disclosure relates to the technical field of display, and in particular to a light emitting diode (LED) display device.

BACKGROUND

In an existing layout design of an LED display device, four via holes are usually drilled on a substrate for each pixel, which has high design difficulty and complexity.

Taking FIG. 1 as an example, in each pixel, anodes (or cathodes) of a red LED, a green LED and a blue LED are connected through a first metal line 01 (in a top metal layer). The first metal line 01 is electrically connected, via a first via hole, with a second metal line 02 (in a bottom metal layer) which passes through a row of pixels. Cathodes (or anodes) of the red LED, the green LED and the blue LED are respectively electrically connected with a third metal line 03 via a second via hole, with a fourth metal line 04 via a third hole, and with a fifth metal line 05 via a fourth via hole. These metal lines are used to load a driving signal, and four via holes are needed in this layout design.

However, because a via hole occupies a large area and usually has a larger width than a metal line, each pixel occupies a large area and it is difficult to reduce the distance between pixels (i.e., point distance, that is, the distance between a pair of adjacent LED lights of the same color), which results in unclearing image and low resolution. In addition, due to the design of the four via holes and the five mental lines in each pixel as well as the connection between the metal lines and the driving chip of the display device, the production process is complex, difficult and expensive.

Therefore, it is desired to solve the technical problem of how to reduce the distance between pixels of an LED display device and decrease the complexity of production process.

SUMMARY

In view of this, a LED display device is provided to reduce the distance between pixels, improve the resolution, and reduce the complexity and difficulty of substrate fabrication. The technical solution is as follows.

An LED display device includes a substrate, and multiple pixel units arranged in array on the substrate. Each of the pixel units includes three LEDs with different emitting colors. The three LEDs are a red LED, a green LED and a blue LED. The LED display device further includes a lateral through line in each row of the pixel units and a first vertical through line, a second vertical through line and a third vertical through line in each column of the pixel units.

The lateral through line in each row of the pixel units is arranged on the same side of the substrate as the pixel units, which is connected directly with a first electrode of each of the LEDs in the row of the pixel units and configured to load a signal for driving the first electrode.

The first vertical through line, the second vertical through line and the third vertical through line in each column of the pixel units are arranged on the opposite side of the substrate to the pixel units, which are electrically connected with a second electrode of each of the LEDs in the column of the pixel units and configured to load a signal for driving the second electrode.

In each of the pixel units, the second electrode of the red LED is electrically connected with the first vertical through line via a first via hole, the second electrode of the green LED is electrically connected with the second vertical through line via a second via hole, and the second electrode of the blue LED is electrically connected with the third vertical through line via a third via hole.

In an embodiment of the LED display device, in each row of the pixel units, one end of the lateral through line is electrically connected with a pin of a driving chip via a first through hole.

In an embodiment of the LED display device, in a pair of adjacent rows of the pixel units, the first through hole in one row is arranged at an ending end of the lateral through line in the one row, and the first through hole in the other row is arranged at a beginning end of the lateral through line in the other row.

In an embodiment of the LED display device, in each column of the pixel units, one end of the first vertical through line, one end of the second vertical through line and one end of the third vertical through line are electrically connected with pins of the driving chip via second through holes respectively.

In an embodiment of the LED display device, in each column of the pixel units, two of the second through holes are arranged at ending ends of the first vertical through line and the third vertical through line respectively, the other one of the second through holes is arranged at a beginning end of the second vertical through line.

Alternatively, in each column of the pixel units, two of the second through holes are arranged at beginning ends of the first vertical through line and the third vertical through line respectively, the other one of the second through holes is arranged at an ending end of the second vertical through line.

In an embodiment of the LED display device, in a pair of adjacent columns of the pixel units, arrangement of the second through holes in one column of the pixel units is different from arrangement of the second through hole in the other column of the pixel units.

In an embodiment of the LED display device, the first electrode is an anode, and the second electrode is a cathode; or the first electrode is a cathode, and the second electrode is an anode.

In an embodiment of the LED display device, the lateral through line, the first vertical through line, the second vertical through line and the third vertical through line are made of a same metal material.

In an embodiment of the LED display device, the first vertical through line, the second vertical through line and the third vertical through line are arranged in a same layer and parallel to each other.

In an embodiment of the LED display device, in each of the pixel units, the lateral through line is arranged on a same side of the three LEDs.

In an embodiment of the LED display device, in each of the pixel units, the lateral through line is arranged between two of the three LEDs and one of the three LEDs.

In an embodiment of the LED display device, the second electrodes of a pair of adjacent red LEDs are connected with the first vertical through line via the same first via hole, the second electrodes of a pair of adjacent green LEDs are connected with the second vertical through line via the same second via hole, and the second electrodes of a pair of adjacent blue LEDs are connected with the third vertical through line via the same third via hole.

In an embodiment, the LED display device further includes: a first connection line electrically connected to the second electrodes of the pair of adjacent red LEDs, a second connection line electrically connected to the second electrodes of the pair of adjacent green LEDs, and a third connection line electrically connected to the second electrodes of the pair of adjacent blue LEDs on a surface of the substrate in each column of the pixel units. The first connection line is directly electrically connected with the first vertical through line via the first via hole, the second connection line is directly electrically connected with the second vertical through line via the second via hole, and the third connection line is directly electrically connected with the third vertical through line via the third via hole.

In an embodiment, the LED display device further includes: a first electrode leg and a first substrate leg connected to each other, corresponding to each of the first electrodes in a one-to-one manner; and a second electrode leg and a second substrate leg connected to each other, corresponding to each of the second electrodes in a one-to-one manner.

In an embodiment of the LED display device, the first electrode leg and the first substrate leg are stacked between the corresponding first electrode and the lateral through line.

In an embodiment of the LED display device, in a case that some or all of the LEDs are flip-chip type LEDs, in each of the flip-chip type LEDs, the second electrode leg and the second substrate leg are stacked between the second electrode and one of the first connection line, the second connection line and the third connection line.

In an embodiment of the LED display device, in a pair of adjacent rows of the pixel units, the position relation between the first electrode and the second electrode of each of the flip-chip type LEDs in one row is reverse to the position relation between the first electrode and the second electrode of each of the flip-chip type LEDs in the other row.

In an embodiment of the LED display device, in a case that some or all of the LEDs are metal wire bonding LEDs, in each of the metal wire bonding LEDs, the second electrode leg is located above metal wire bonding LED, and the second substrate leg is arranged on a surface of one of the first connection line, the second connection line and the third connection line, and the second electrode leg is electrically connected with the second substrate leg through a metal bonding wire.

In an embodiment of the LED display device, the lateral through line, the first connection line, the second connection line and the third connection line are arranged in a same layer. The first vertical through line, the second vertical through line and the third vertical through line are arranged in a same layer.

In an embodiment of the LED display device, the lateral through line, the first vertical through line, the second vertical through line, the third vertical through line, the first connection line, the second connection line and the third connection line are made of a same metal material.

The LED display device provided in the present disclosure includes the substrate, and the multiple pixel units arranged in array on the substrate. Each of the pixel units includes three LEDs with different emitting colors, and the three LEDs are a red LED, a green LED and a blue LED. The LED display device further includes a lateral through line in each row of the pixel units, arranged on the same side of the substrate as the pixel units, which is connected directly with a first electrode of each of the LEDs in the row of the pixel units and configured to load a signal for driving the first electrode; and a first vertical through line, a second vertical through line and a third vertical through line in each column of the pixel units, arranged on the opposite side of the substrate to pixel units, which are electrically connected with a second electrode of each of the LEDs in the column of the pixel units and configured to load a signal for driving the second electrode. In each of the pixel units, the second electrode of the red LED is electrically connected with the first vertical through line via a first via hole, the second electrode of the green LED is electrically connected with the second vertical through line via a second via hole, and the second electrode of the blue LED is electrically connected with the third vertical through line via a third via hole. In the present disclosure, only three via holes are required for a layout of one pixel, which can reduce the distance between pixels, improve the resolution and improve the quality of display. In addition, the design of the via holes, the lateral through line and the vertical through line can reduce the complexity and difficulty of the substrate fabrication.

BRIEF DESCRIPTION OF THE DRAWINGS

For clearer illustrating embodiments of the present application or the technical solution in the conventional technology, drawings used to describe the embodiments or the conventional technology will be briefly described hereinafter. Apparently, the drawings in the following description only illustrate some embodiments of the present application, and for those skilled in the art, other drawings may be obtained based on these drawings without any creative efforts.

DETAILED DESCRIPTION

The following will be a clear and complete description of the technical solution in the embodiment of the present disclosure in conjunction with the accompanying drawings in the embodiment of the present disclosure. Obviously, the described embodiments are only part of the embodiments of the present disclosure, rather than all of the embodiments. Based on the embodiments of the present disclosure, all other embodiments obtained by those skilled in the art without creative work are all in the scope of the protection.

Figure 1:
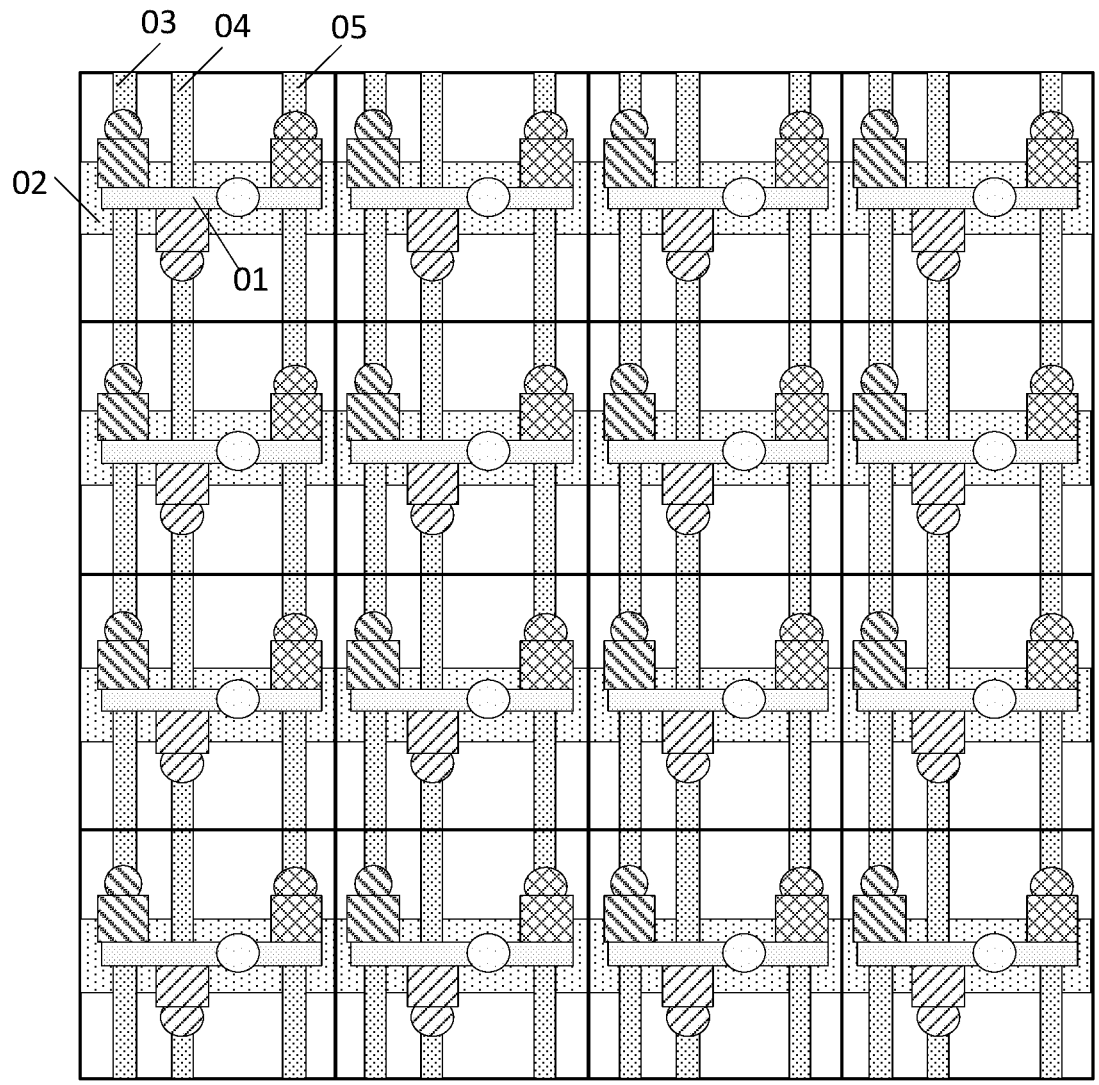
FIG. 1 is a schematic structural diagram of an existing LED display device.
Figure 2:
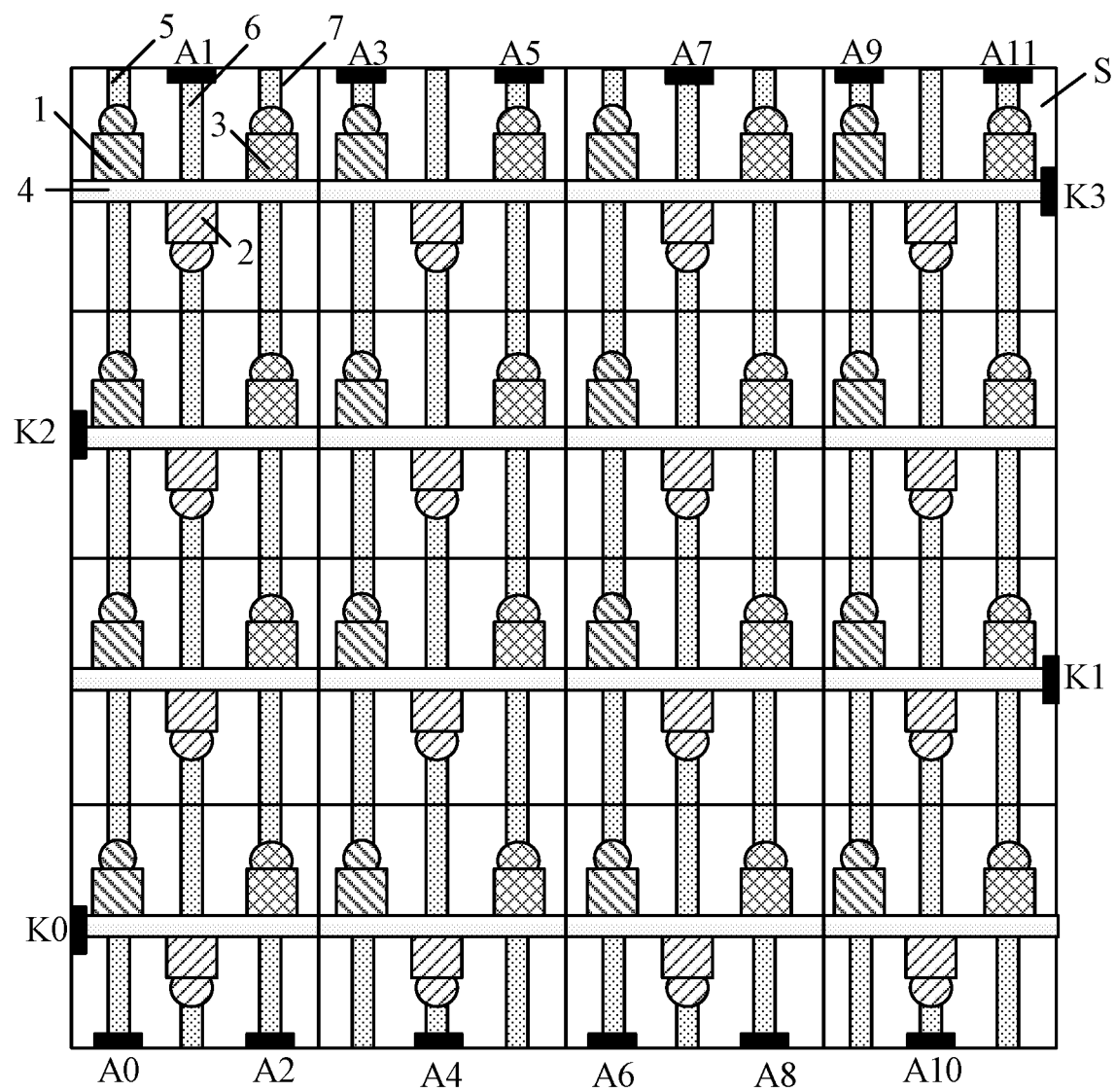
FIG. 2 is a first structural schematic diagram of an LED display device according to an embodiment of the present disclosure.
Figure 3:
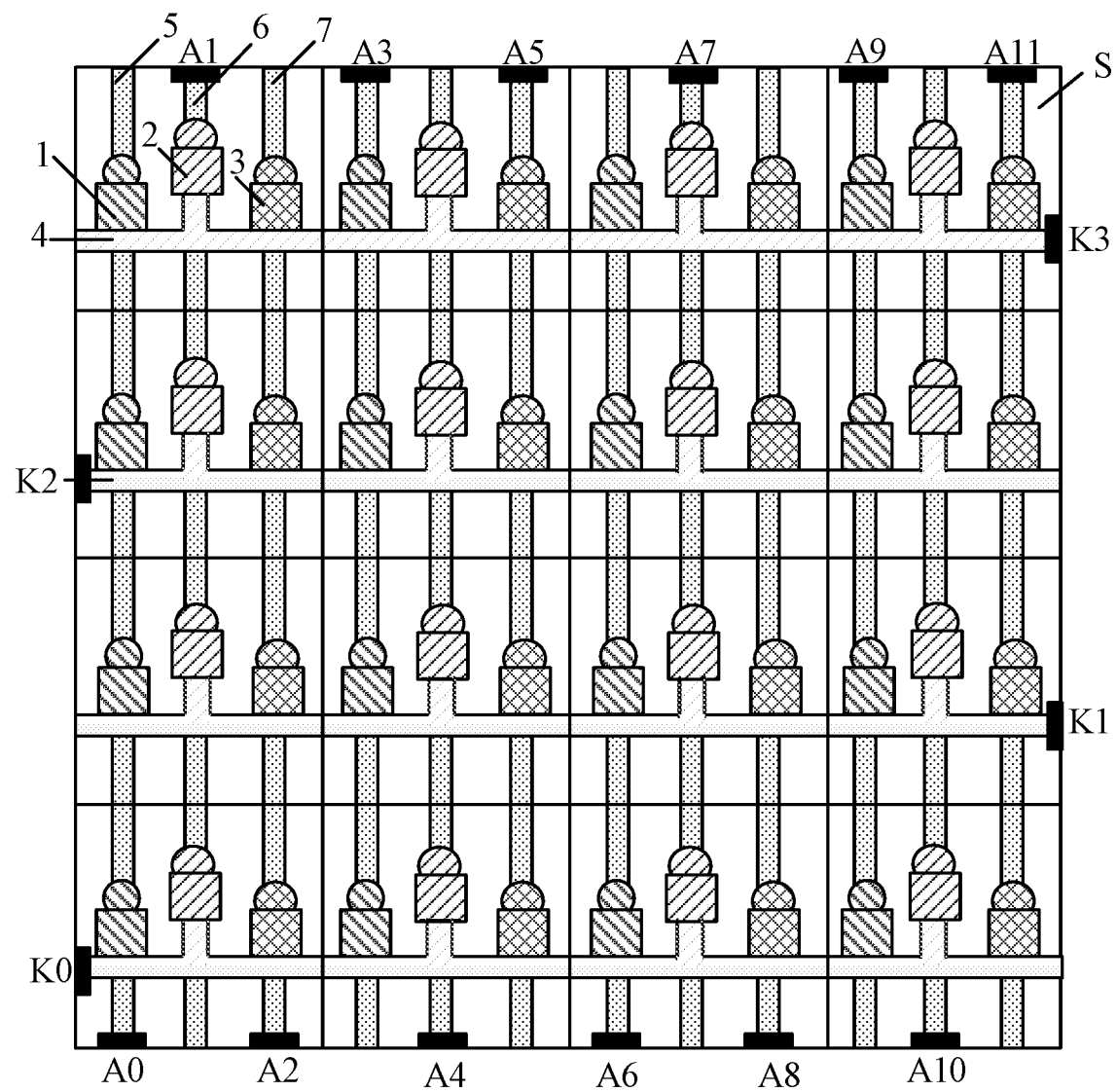
FIG. 3 is a second structural schematic diagram of an LED display device according to an embodiment of the present disclosure.

An LED display device provided in the present disclosure, as shown in FIG. 2 and FIG. 3, includes a substrate S and multiple pixel units arranged in array on the substrate S. Each of the pixel units includes three LEDs with different emitting colors, and the three LEDs are a red LED 1, a green LED 2 and a blue LED 3. The LED display device further includes: a lateral through line 4 in each row of the pixel units, and a first vertical through line 5, a second vertical through line 6 and a third vertical through line 7 in each column of the pixel units.

The lateral through line 4 in each row of the pixel units is arranged on the same side of the substrate as the pixel units, which is connected directly with a first electrode of each of the LEDs in the row of the pixel units and configured to load a signal for driving the first electrode.

The first vertical through line 5, the second vertical through line 6 and the third vertical through line 7 in each column of the pixel units are arranged on the opposite side of the substrate to the pixel units, which are electrically connected with a second electrode of each of the LEDs in the column of the pixel units and configured to load a signal for driving the second electrode.

In each of the pixel units, the second electrode of the red LED 1 is electrically connected with the first vertical through line 5 via a first via hole, the second electrode of the green LED 2 is electrically connected with the second vertical through line 6 via a second via hole, and the second electrode of the blue LED 3 is electrically connected with the second vertical through line 7 via a third via hole.

It should be noted that, the multiple pixel units arranged in array may be M*N pixel units (M≥1, N≥1), and are not limited to 4*4 pixel units in the accompanying drawings of the present disclosure. In each pixel unit, the arrangement of the order of the red LED, the green LED and the blue LED may be different, including RGB, RBG GRB, GBR, BRG and BGR, not being limited to the RGB arrangement in the accompanying drawings of the present disclosure.

In the LED display device provided in the embodiment of the present disclosure, in each row of the pixel units, the first electrode of each LED is connected directly with the lateral through line. In each column of the pixel units, the second electrode of the red LED is electrically connected with the first vertical through line via the first via hole, the second electrode of the green LED is electrically connected with the second vertical through line via the second via hole, and the second electrode of the blue LED is electrically connected with the second vertical through line via the third via hole. Thus only three via holes are required for a layout of one pixel, which can reduce the distance between pixels, improve the resolution and improve the quality of display. In addition, the simple design of the via holes, the lateral through line and the vertical through line can reduce the complexity and difficulty of the substrate fabrication.

In an embodiment of the LED display device of the present disclosure, the first electrode is an anode, and the second electrode is a cathode; or the first electrode is a cathode, and the second electrode is an anode. The lateral through line, the first vertical through line, the second vertical through line and the third vertical through line are made of the same metal material. In practices, as shown in FIG. 2 and FIG. 3, the first vertical through line, the second vertical through line and the third vertical through line are arranged in a same layer and parallel to each other.

In another embodiment of the LED display device of the present disclosure, as shown in FIG. 2, in each of the pixel units, the lateral through line 4 is arranged between two LEDs and one LED. FIG. 2 shows that the red LED and the blue LED are arranged on one side of the lateral through line 4, while the green LED is arranged on the other side of the lateral through line 4.

In addition, in another embodiment of the LED display device of the present disclosure, as shown in FIG. 3, in each of the pixel units, the lateral through line 4 is arranged on the same side of the three LEDs.

Figure 4:
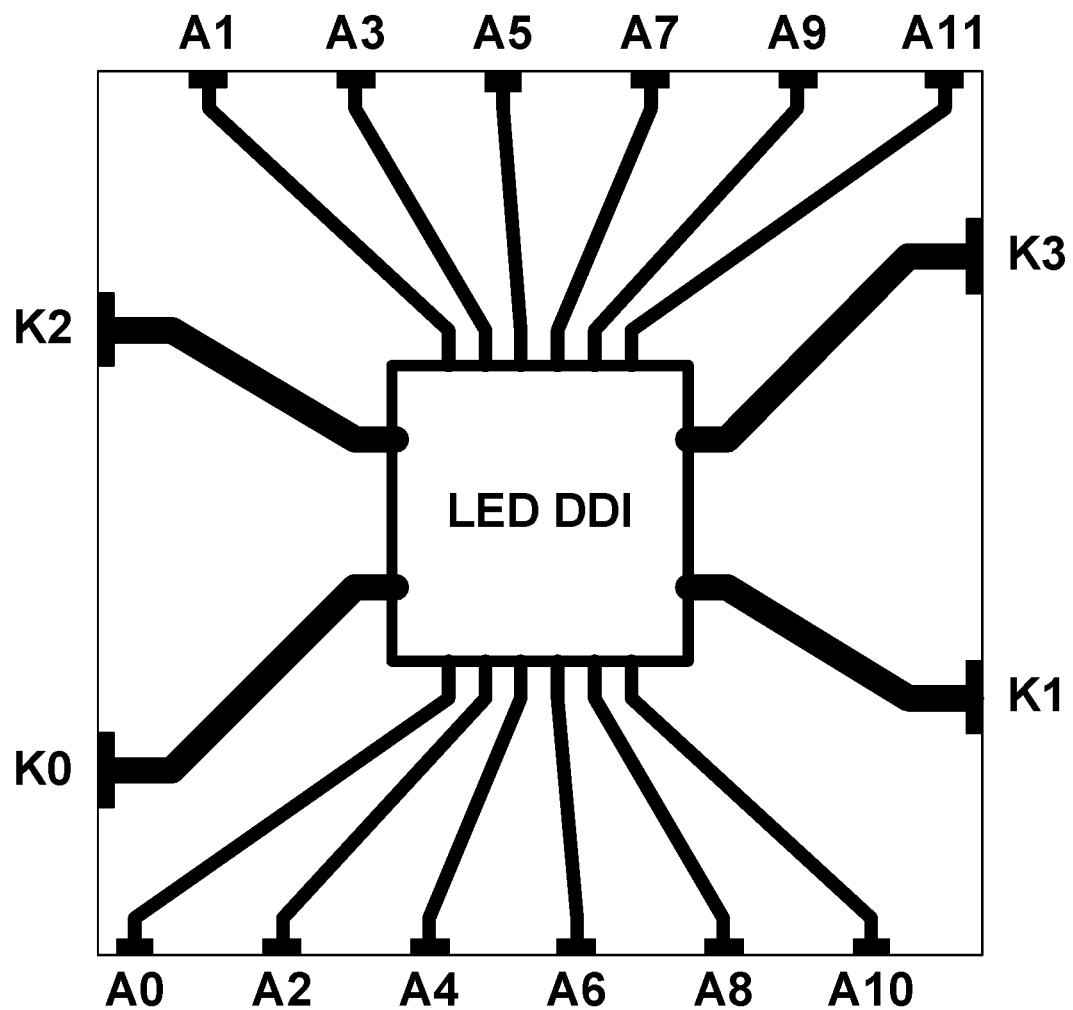
FIG. 4 is a schematic diagram of the position relationship between the driving chip and through holes according to an embodiment of the present disclosure.

In an embodiment of the LED display device of the present disclosure, as shown in FIG. 2 to FIG. 4, in each row of the pixel units, one end of the lateral through line 4 is electrically connected with a pin of a driving chip (DDI) via a first through hole (such as K0, K1, K2 and K3).

In another embodiment, as shown in FIG. 2 and FIG. 3, in a pair of adjacent rows of the pixel units, the first through hole in one row is arranged at an ending end of the lateral through line in the one row, and the first through hole in the other row is arranged at a beginning end of the lateral through line in the other row. FIG. 2 and FIG. 3 show that K3 is arranged at the ending end of the lateral through line, K2 is arranged at the beginning end of the lateral through line, K1 is arranged at the end of the lateral through line, and K0 is arranged at the end of the lateral through line. This crossing arrangement can reduce the difficulty of wiring design and simplify the process.

Further, in the LED display device of the present disclosure, as shown in FIG. 2 to FIG. 4, in each column of the pixel units, one end of the first vertical through line 5, one end of the second vertical through line 6 and one end of the third vertical through line 7 are electrically connected with pins of the driving chip (DDI) via second through holes (such as A0, A1, A2, A3, A4, A5, A6, A7, A8, A9, A10) respectively.

In another embodiment, as shown in FIG. 2 and FIG. 3, in each column of the pixel units, two of the second through holes are arranged at endings ends of the first vertical through line and the third vertical through line respectively, and the other one of the second through holes is arranged at a beginning end of the second vertical through line. Alternatively, in each column of the pixel units, two of the second through holes are arranged at beginning ends of the first vertical through line and the third vertical through line respectively, and the other one of the second through holes is arranged at an ending end of the second vertical through line. In a pair of adjacent columns of the pixel units, the positions of the second through holes in one column of the pixel units may be different from the positions of the second through holes in the other column of the pixel units. As shown in FIG. 2 and FIG. 3, in the first column of the pixel units, A0 and A2 are arranged at the ending ends of the first vertical through line and the third vertical through line respectively, and A1 is arranged at the beginning end of the second vertical through line. In the second column of the pixel units, A3 and A5 are arranged at the ending ends of the first vertical through line and the third vertical through line respectively, and A2 is arranged at the beginning end of the second vertical through line. This crossing arrangement can reduce the difficulty of wiring design and simplify the process.

It should be noted that, the first through hole and the second through hole can be summarized as sidewall through holes. With the design of the sidewall through holes, the light board with the LEDs and the driving board with the driving chip can be produced separately, and then connected to each other, which makes the process simpler.

Figure 5:
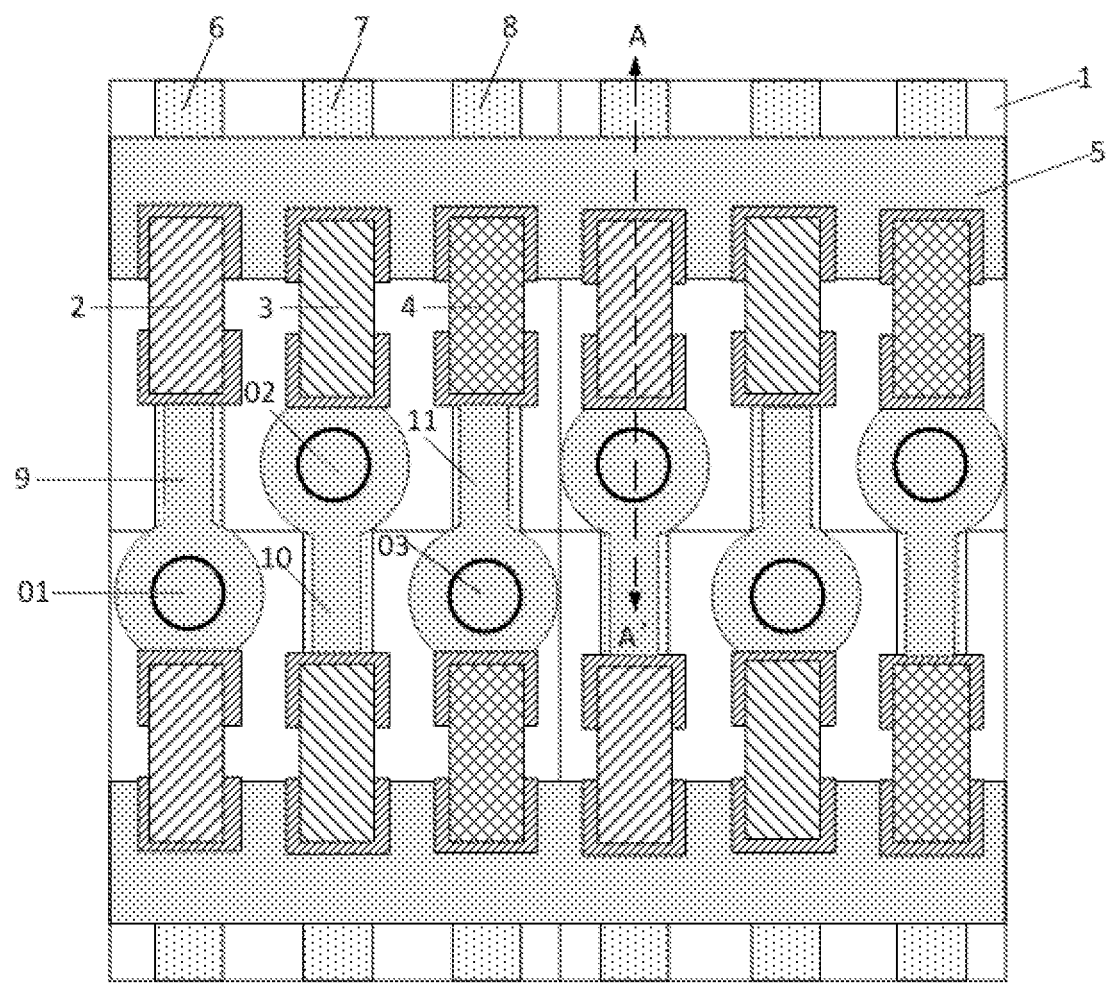
FIG. 5 is a first top view of an LED display device according to an embodiment of the present disclosure.

In another embodiment, as shown in FIG. 5, the second electrodes of a pair of adjacent red LEDs 1 are connected with the first vertical through line 5 via a same first via hole 01, the second electrodes of a pair of adjacent green LEDs 2 are connected with the second vertical through line 6 via a same second via hole 02, and the second electrodes of a pair of adjacent blue LEDs 3 are connected with the third vertical through line 7 via a same third via hole 03.

Figure 7:
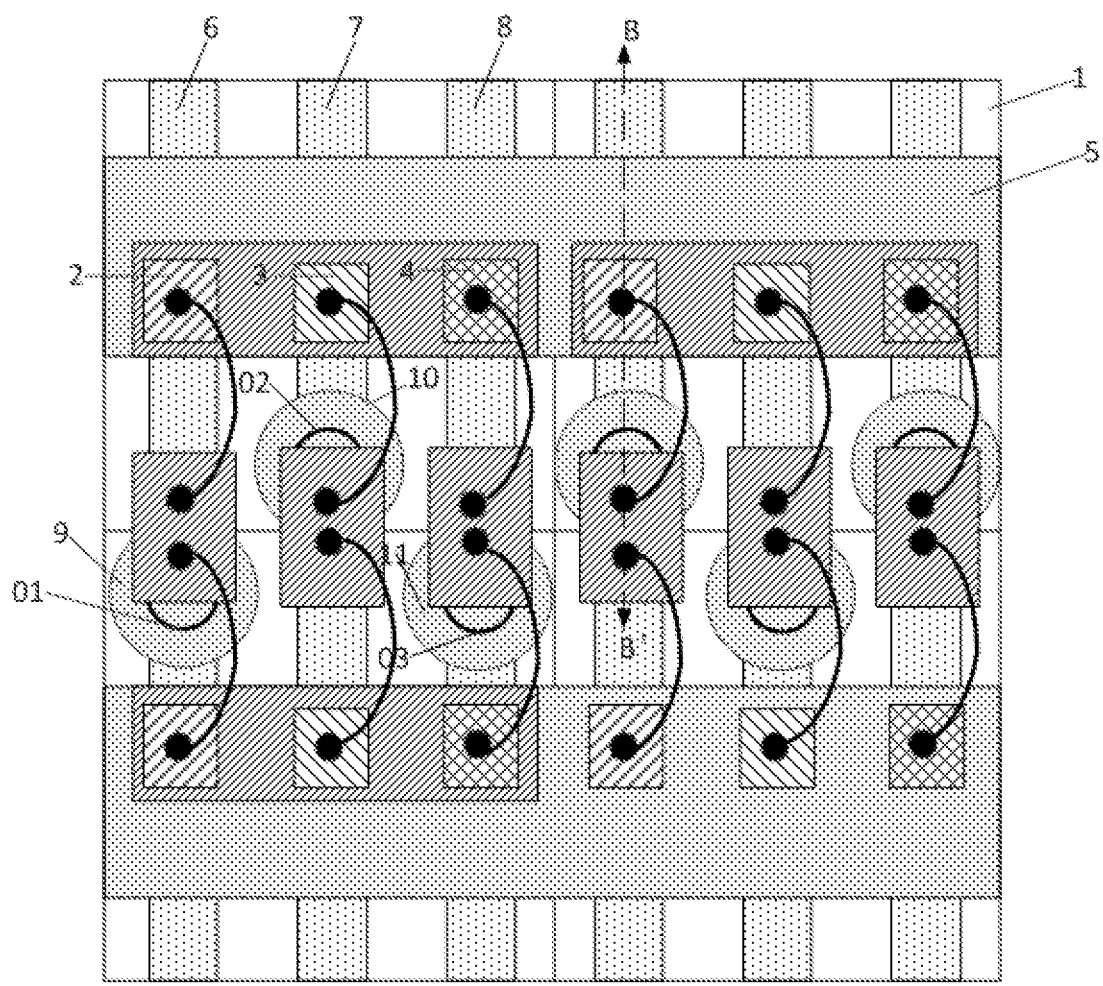
FIG. 7 is a second top view of an LED display device according to an embodiment of the present disclosure.
Figure 9:
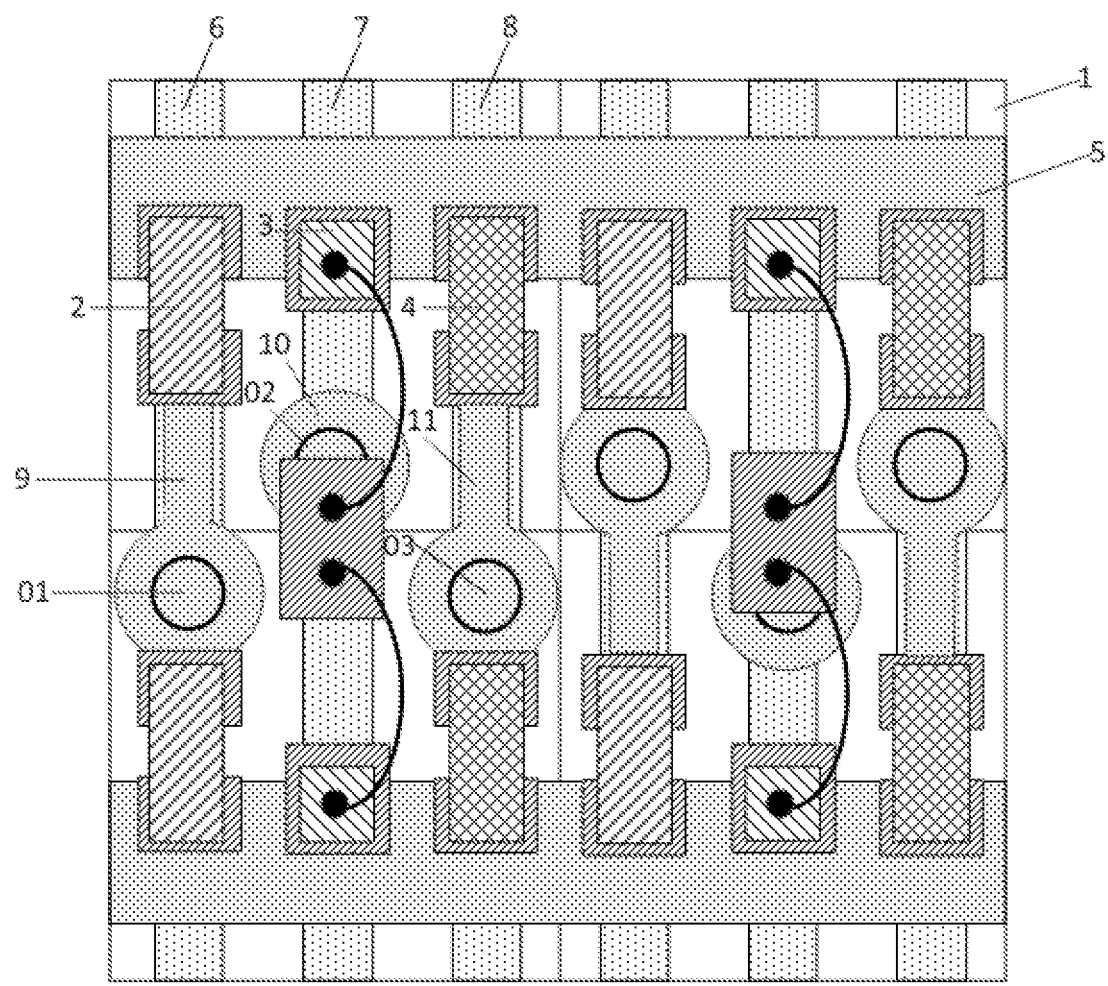
FIG. 9 is a third top view of an LED display device according to an embodiment of the present disclosure.

The LEDs in the present disclosure may be flip-chip type LEDs or metal wire bonding LEDs. For example, all the LEDs in FIG. 5 are flip-chip type LEDs, all the LEDs in FIG. 7 are metal wire bonding LEDs, and some of the LEDs are flip-chip type LEDs and some of the LEDs are metal wire bonding LEDs in FIG. 9.

In the LED display device provided in the embodiment of the present disclosure, in each column of the pixel units, a layout design of a pair of adjacent pixels needs only three via holes. That is, a layout design of four pixels arranged in a square only needs six via holes, which can reduce the distance between pixels, improve the resolution, and improve the quality of display. The simple layout of the via holes, the lateral through line and the three vertical through lines can reduce the complexity and difficulty of the substrate fabrication.

In an embodiment, as shown in FIG. 5, the LED display device further includes: on a surface of the substrate S in each column of the pixel units, a first connection line 9 electrically connected to the second electrodes of a pair of adjacent red LEDs 1, a second connection line 10 electrically connected to the second electrodes of a pair of adjacent green LEDs 2, and a third connection line 11 electrically connected to the second electrodes of a pair of adjacent blue LEDs 3. The first connection line 9 is directly electrically connected with the first vertical through line 5 via the first via hole 01, the second connection line 10 is directly electrically connected with the second vertical through line 6 via the second via hole 02, and the third connection line 11 is directly electrically connected with the third vertical through line 7 via the third via hole 03.

Figure 6:
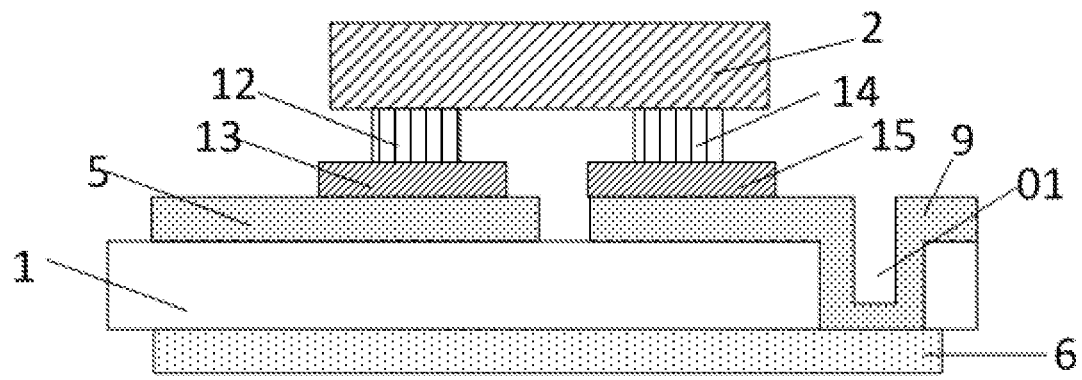
FIG. 6 is a schematic diagram of a sectional structure along the A-A' direction in FIG. 5.
Figure 8:
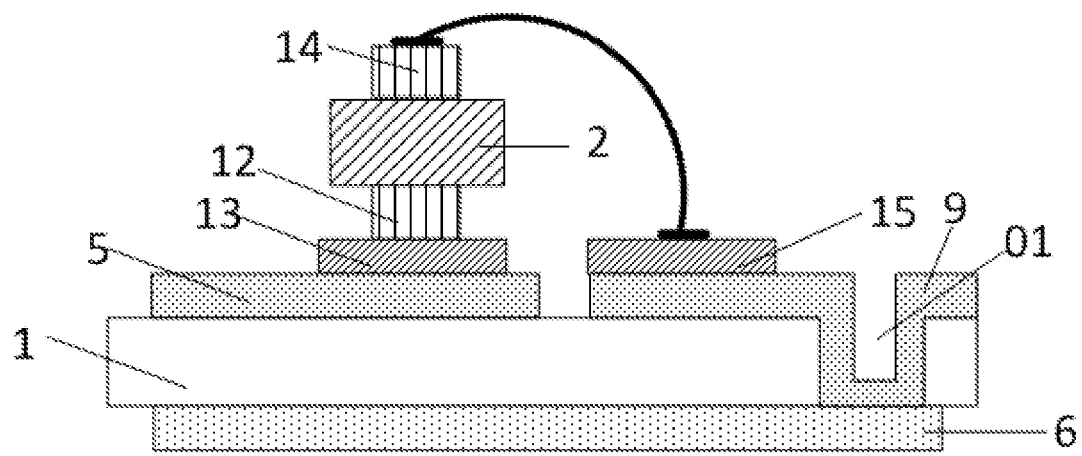
FIG. 8 is a schematic diagram of a sectional structure along the B-B' direction in FIG. 7.

In another embodiment, as shown in FIG. 6 and FIG. 8, the LED display device of the present disclosure further includes: a first electrode leg 12 and a first substrate leg 13 corresponds to each first electrode in a one-to-one manner, and a second electrode leg 14 and a second substrate leg 15 corresponds to each second electrode in a one-to-one manner. It should be noted that the first electrode leg 12 and the first substrate leg 13 are connected electrically, and the second electrode leg 14 and the second substrate leg 15 are connected electrically.

In an embodiment, as shown in FIG. 6 and FIG. 8, the first electrode leg 12 and the first substrate leg 13 may be stacked between the corresponding first electrode and the lateral through line 4. The position of the first via hole 01 is different from the position of the first electrode leg 12 and the first substrate leg 13, thereby improving the flatness of the substrate.

In an embodiment, in a case that some or all of the LEDs are flip-chip type LEDs, in each of the flip-chip type LEDs, the second electrode leg and the second substrate leg are stacked between the corresponding second electrode and one of the first connection line, the second connection line and the third connection line. Taking FIG. 6 as an example, the second electrode leg 14 and the second substrate leg 15 are stacked between the corresponding second electrode and the first connection line 9. That is, the second electrode is electrically connected with the first connection line 9 through the second electrode leg 14 and the second substrate leg 15. Because the first connection line 9 is directly electrically connected with the first vertical through line 5 through the first via hole 01, the second electrode is electrically connected with the first vertical through line 5. In addition, the position of the first via hole 01 is different from the position of the first electrode leg 14 and the first substrate leg 15, thereby improving the flatness of the substrate.

Further, as shown in FIG. 5, in a pair of adjacent rows of the pixel units, the position relation between the first electrode and the second electrode of each of the flip-chip type LEDs in one row may be reverse to the position relation between the first electrode and the second electrode of each of the flip-chip type LEDs in the other row. In this way, the connection between the second electrode of each LED in the pair of adjacent pixel units and the corresponding connection lines is simplified, leading to a simpler layout.

In an embodiment, in a case that some or all of the LEDs are metal wire bonding LEDs, in each of the metal wire bonding LEDs, the second electrode leg is located above the metal wire bonding LED, and the second substrate leg is arranged on a surface of one of the first connection line, the second connection line and the third connection line. The second electrode leg is electrically connected with the second substrate leg through a metal bonding wire 16. Taking FIG. 8 as an example, the second electrode leg 14 is located above the metal wire bonding LED, the second substrate leg 15 is arranged on the surface of the first connection line 9, and the second electrode leg 14 is connected electrically with the second substrate leg 15 through a metal bonding wire 16. That is, the second electrode is electrically connected with the first connection line 9 through the second electrode leg 14, the metal bonding wire 16 and the second substrate leg 15. Because the first connection line 9 is directly electrically connected with the first vertical through line 5 through the first via hole 01, the second electrode is electrically connected with the first vertical through line 5. In addition, the position of the first via hole 01 is different form the position of the first electrode leg 14 and the first substrate leg 15, thereby improving the flatness of the substrate.

In an embodiment, as shown in FIG. 5 and FIG. 6, the lateral through line 4, the first connection line 9, the second connection line 10 and the third connection line 11 may be arranged in a same layer. That is, the lateral through line 4, the first connection line 9, the second connection line 10 and the third connection line 11 may be made of a same metal materials. Therefore, only one patterning process is required to form the pattern of the lateral through line 4, the first connection line 9, the second connection line 10 and the third connection line 11, leading to a simple production process and a low cost. Similarly, the first vertical through line 5, the second vertical through line 6 and the third vertical through line 7 may be arranged in a same layer. That is, the first vertical through line 5, the second vertical through line 6 and the third vertical through line 7 may be made of a same metal materials. Therefore only one patterning process is required to form the pattern of the first vertical through line 5, the second vertical through line 6 and the third vertical through line 7, leading to a simple production process and a low cost. Apparently, the lateral through line, the first vertical through line, the second vertical through line, the third vertical through line, the first connection line, the second connection line and the third connection line may all be made of the same metal material.

It needs to be explained that in this disclosure, relational terms such as first and second are used only to distinguish one entity or operation from another entity or operation, and not necessarily require or imply any such actual relationship or order between these entities or operations. Furthermore, the term "including", "inclusion", or any other variant of the term is intended to cover non-exclusive inclusions, so that the processes, methods, items, or devices that include a series of elements include not only those elements, but also other elements that are not clearly listed, or elements inherent to the processes, methods, items, or devices. Without more restrictions, the phrase "including a . . . " does not exclude that there are other same elements in the processes, methods, articles or devices that include the element.

The LED display device is described in detail above. In this disclosure, the principles and implementation methods of the technical solutions are illustrated with examples, which are only used to help the understanding of the methods and the core ideas of the technical solution. For those skilled in the art, according to the idea in the present disclosure, changes may be made to the specific implementation and application scope. In summary, the content of this specification should not be understood as a limitation to the technical solutions in the present disclosure.

The invention claimed is:

1. A light emitting diode (LED) display device, comprising:
   a substrate;
   a plurality of pixel units arranged in array on the substrate, wherein each of the plurality of pixel units comprises three LEDs with different emitting colors, and the three LEDs are a red LED, a green LED and a blue LED;
   a lateral through line in each row of the plurality of pixel units, which is connected directly with a first electrode of each LED in each row of the plurality of pixel units and configured to load a first signal for driving the first electrode, the lateral through line and the plurality of pixel units are arranged on a same side of the substrate; and
   a first vertical through line, a second vertical through line and a third vertical through line in each column of the plurality of pixel units, arranged on an opposite side of the substrate to the plurality of pixel units, which are electrically connected with a second electrode of each LED in the each column of the plurality of pixel units and configured to load a second signal for driving the second electrode,
   wherein in each of the plurality of pixel units, the second electrode of the red LED is electrically connected with the first vertical through line via a first via hole, the second electrode of the green LED is electrically connected with the second vertical through line via a second via hole, and the second electrode of the blue LED is electrically connected with the third vertical through line via a third via hole,
   wherein in each row of the plurality of pixel units, one of an beginning end and an ending end of the lateral through line is electrically connected with a first pin of a driving chip via a first through hole,
   wherein in a pair of adjacent rows of the plurality of pixel units, the first through hole in one row of the pair of adjacent rows is arranged at the ending end of the lateral through line in the one row of the pair of adjacent rows, and the first through hole in the other row of the pair of adjacent rows is arranged at the beginning end of the lateral through line in the other row of the pair of adjacent rows.

2. The LED display device according to claim 1, wherein in each column of the plurality of pixel units, one of a beginning end and an ending end of each of the first vertical through line, the second vertical through line and the third vertical through line are respectively electrically connected with corresponding second pin of the driving chip via a corresponding one of the second through holes, wherein there are three second pins and three second through holes correspond to each column of the plurality of pixel units.

3. The LED display device according to claim 2, wherein in each column of the plurality of pixel units, two of the three second through holes are arranged at the ending end of the first vertical through line and the ending end of the third vertical through line respectively, and other one of the three second through holes is arranged at the beginning end of the second vertical through line; or
   in each column of the plurality of pixel units, two of the three second through holes are arranged at the beginning end of the first vertical through line and the beginning end of the third vertical through line respectively, and the other one of the three second through holes is arranged at the ending end of the second vertical through line.

4. The LED display device according to claim 3, wherein in a pair of adjacent columns of the plurality of pixel units, positions of three second through holes in one column of the pair of adjacent columns are different from positions of three second through holes in other column of the pair of adjacent columns.

5. The LED display device according to claim 1, wherein the first electrode is an anode, and the second electrode is a cathode; or
   the first electrode is a cathode, and the second electrode is an anode.

6. The LED display device according to claim 1, wherein the lateral through line, the first vertical through line, the second vertical through line and the third vertical through line are made of a same metal material.

7. The LED display device according to claim 6, wherein the first vertical through line, the second vertical through line and the third vertical through line are arranged in a same layer and parallel to each other.

8. The LED display device according to claim 7, wherein in each of the plurality of pixel units, the lateral through line is arranged on a same side of the three LEDs.

9. The LED display device according to claim 7, wherein in each of the plurality of pixel units, the lateral through line is arranged between two of the three LEDs and one of the three LEDs.

10. The LED display device according to claim 1, wherein the second electrodes of a pair of adjacent red LEDs are connected with the first vertical through line via the first via hole,
    the second electrodes of a pair of adjacent green LEDs are connected with the second vertical through line via the second via hole, and
    the second electrodes of a pair of adjacent blue LEDs are connected with the third vertical through line via the third via hole.

11. The LED display device according to claim 10, on a surface of the substrate in each column of the plurality of pixel units, further comprising:
    a first connection line electrically connected to the second electrodes of the pair of adjacent red LEDs, a second connection line electrically connected to the second electrodes of the pair of adjacent green LEDs, and a third connection line electrically connected to the second electrodes of the pair of adjacent blue LEDs;

wherein the first connection line is directly electrically connected with the first vertical through line via the first via hole, the second connection line is directly electrically connected with the second vertical through line via the second via hole, and the third connection line is directly electrically connected with the third vertical through line via the third via hole.

12. The LED display device according to claim 11, further comprising:

a first electrode leg and a first substrate leg electrically connected to each other, corresponding to each of the first electrodes in a one-to-one manner; and a second electrode leg and a second substrate leg electrically connected to each other, corresponding to each of the second electrodes in a one-to-one manner.

13. The LED display device according to claim 12, wherein the first electrode leg and the first substrate leg are stacked between corresponding first electrode and the lateral through line.

14. The LED display device according to claim 12, wherein in a case that some or all of LEDs in the LED display device are flip-chip type LEDs, in each of the flip-chip type LEDs;

the second electrode leg and the second substrate leg are stacked between a corresponding one of the second electrodes and one of the first connection line, the second connection line and the third connection line.

15. The LED display device according to claim 14, wherein in a pair of adjacent rows of the plurality of pixel units, a position relation between the first electrode and the second electrode of each of the flip-chip type LEDs in one row is reverse to a position relation between the first electrode and the second electrode of each of the flip-chip type LEDs in the other row.

16. The LED display device according to claim 12, wherein in a case that some or all of LEDs in the LED display device are metal wire bonding LEDs, in each of the metal wire bonding LEDs:

the second electrode leg is located above each metal wire bonding LED, and the second substrate leg is arranged on a surface of one of the first connection line, the second connection line and the third connection line; and the second electrode leg is electrically connected with the second substrate leg through a metal bonding wire.

17. The LED display device according to claim 10, wherein the lateral through line, the first connection line, the second connection line and the third connection line are arranged in a same layer; and the first vertical through line, the second vertical through line and the third vertical through line are arranged in a same layer.

18. The LED display device according to claim 17, wherein the lateral through line, the first vertical through line, the second vertical through line, the third vertical through line, the first connection line, the second connection line and the third connection line are made of a same metal material.

* * * * *